United States Patent [19]

Wilcox

[11] 4,063,193
[45] Dec. 13, 1977

[54] DIFFERENTIAL TRANSISTOR PAIR INTEGRATED CIRCUIT OSCILLATOR WITH L-C TANK CIRCUIT

[75] Inventor: Milton E. Wilcox, San Jose, Calif.

[73] Assignee: National Semiconductor Corporation, Santa Clara, Calif.

[21] Appl. No.: 731,167

[22] Filed: Oct. 12, 1976

[51] Int. Cl.² ............................................. H03B 5/12
[52] U.S. Cl. .......................... 331/117 R; 331/108 D; 331/113 R; 331/176
[58] Field of Search ........... 331/117 R, 116 R, 113 R, 331/108 C, 108 D, 168, 176; 307/291, 292

[56] References Cited

U.S. PATENT DOCUMENTS 3,275,846  9/1966  Bailey .............................. 307/292 X

OTHER PUBLICATIONS

Frederiksen et al., "A Single-Chip Monolithic Sonar System," IEEE Journal of Solid-State Circuits, vol. SC-9, Dec. 1974, pp. 394–403.

Sankaranarayanan, "Negative-resistance Transistorized Oscillator," Electronic Engineering, Nov. 1967, p. 715.

Primary Examiner—Siegfried H. Grimm
Attorney, Agent, or Firm—Gail W. Woodward; Willis E. Higgins

[57] ABSTRACT

A differential transistor pair has an antiresonant tank connected between collectors. Feedback is achieved using a pair of cross connected zener diodes biased into reverse breakdown. A balanced two-pin version provides paraphase output and an unbalanced single-pin version is available for single phase output. The single pin version can include a current mirror for biasing the zener diodes with constant current. The oscillator can be temperature compensated by means of a temperature programmed current source.

6 Claims, 4 Drawing Figures

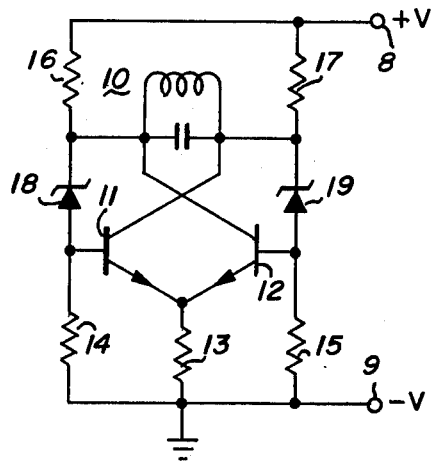
Fig_1
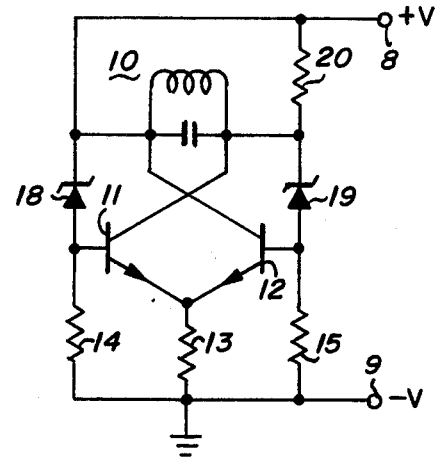
Fig_2
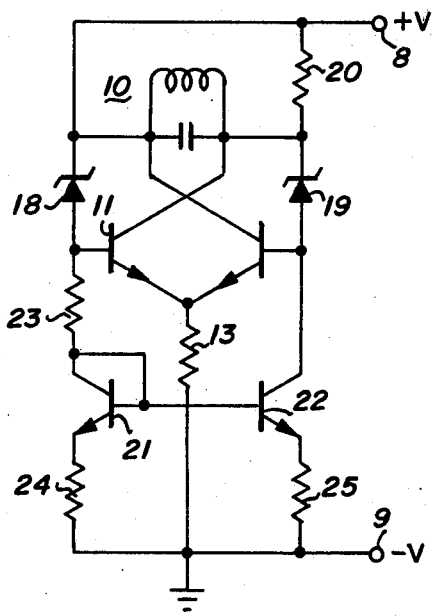
Fig_3
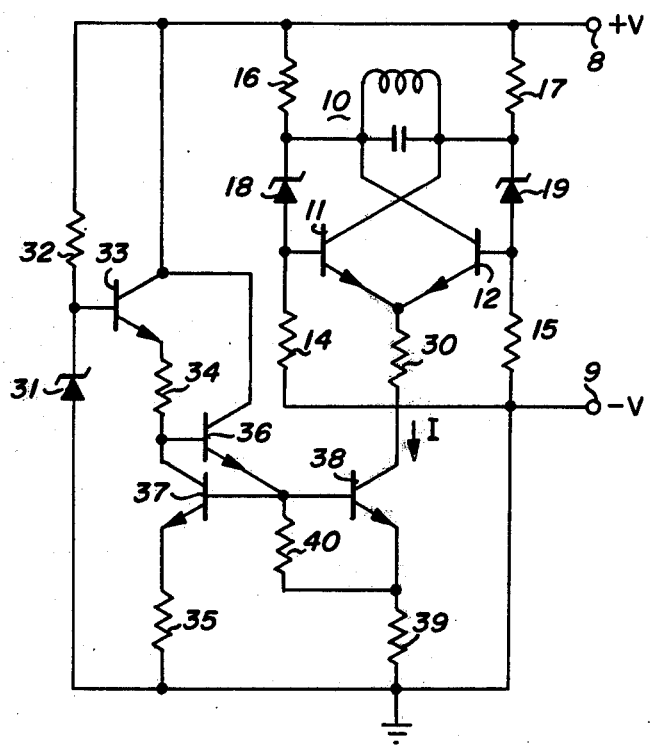
Fig_4

DIFFERENTIAL TRANSISTOR PAIR INTEGRATED CIRCUIT OSCILLATOR WITH L-C TANK CIRCUIT

BACKGROUND OF THE INVENTION

Integrated circuit oscillators typically employ an external frequency determining element and the prior art circuits are notorious for generating spurious signals and adversely reacting upon the frequency determining capability of the external element. Many prior art circuits are unsuitable because of their excessive response to termperature changes. Typically, prior art circuits employ capacitors to provide the signal feedback required for oscillation. IC capacitors fabricated into the substrate as a p-N junction require special isolation and display stray capacitance, their capacitance varies with voltage, and they require considerable IC chip area. Furthermore, their characteristics are a strong function of temperature. When the capacitors are fabricated into the IC oxide, thin oxides must be used and the actual capacitors value is difficult to control. This makes them difficult to integrate into a manufacturing process. Finally, capacitor feedback circuits often introduce phase shift to their own and thus tend to pull the oscillator frequency and introduce frequency instability problems.

Many prior art circuits have been direct coupled to avoid capacitors and this approach will remove some of the deleterious capacitance-related effects. However, when a transistor collector is connected directly to a base, the available signal swing is greatly reduced. Also, even with severely restricted signal swing, nonlinearities and even rectification effects are encountered. These result in spurious signal production and detract from fequency stability.

SUMMARY OF THE INVENTION

It is an object of the invention to provide an oscillator circuit suitable for IC form that removes many of the limitations of prior art IC oscillators.

It is a further object of the invention to provide an oscillator circuit capable of either single or double pin connection suitable for IC form in which large signal output signals are available without using capacitors in the feedback section and in which the circuit has very low spurious reaction on an externally connected tank.

It is a feature of the invention that an IC oscillator can easily be temperature compensated by means integral with the IC.

These and other objects and features are achieved in a circuit configured as follows. A differential transistor pair in an IC has an anti-resonant tank coupled between the collectors. Positive feedback is achieved by a pair of cross connected zener diodes that couple opposing collectors and bases in the pair. The diodes are biased into reverse breakdown and poled to operate the transistor bases below the collector potentials. The diode bias is achieved by means of a conductive impedance coupled back to the emitter current source supply. If the circuit is completed by means of balanced conductive impedances coupling the collectors to a source of operating potential, a double pin oscillator is available with paraphase output. If only impedance is employed and the other collector coupled directly to the source of operating potential a single pin single phase oscillator is present.

Such an oscillator, if fabricated using matched components, has very little adverse reaction on the frequency stability of the tank. It can produce on the order of volts of output and is very simple in form.

If desired even better performance can be achieved by using a current mirror to produce a constant zener bias in the single pin version.

The basic oscillator circuit has a falling gain characteristics with increasing temperature and this characteristics has a simple relationship that can easily be compensated by connecting a temperature programmed current source to the emitters in the differential pair.

BRIEF DESCRIPTION OF THE DRAWING

FIG. 1 is a schematic diagram of a fully balanced two-pin version of the circuit of the invention;

FIG. 2 is a schematic diagram of a single-pin version of the circuit of the invention;

FIG. 3 is a schematic diagram of a single-pin oscillator with a current mirror for zener diode biasing; and FIG. 4 is a schematic diagram of a temperature compensated oscillator.

DESCRIPTION OF THE INVENTION

The basic oscillator circuit is shown in FIG. 1. It appears from a potential source connected between terminals 8 and 9 labeled $+V$ and $-V$ respectively. An antiresonant tank 10 is coupled between the collectors of transistors 11 and 12. Resistors 13 acts as a current source supplying the emitters of transistors 11 and 12 which operate as a differential pair. Base resistors 14 and 15 are preferably matched as are collector load resistors 16 and 17. Zener diodes 18 and 19 cross couple the two transistors together so that the differential transistor pair elements are connected in phase aiding cascade configuration having positive feedback. The circuit will oscillate at the frequency of tank circuit 10. Due to the differential connection, transistors 11 and 12 conduct alternatively.

When transistor 11 is on, its collector will be pulled toward ground and the action of tank circuit 10 raises the collector of transistor 12 an equal amount. This via diode 18 pulls the base of transistor 11 up or in a positive direction. During this interval the emitter of transistor 11 will rise to follow its base. Since the base of transistor 12 is low and its emitter high, transistor 12 will be off.

The tank 10 action will thereafter switch conduction to transistor 12 and transistor 11 will be cut off. Since the emitter voltage of the on transistor will follow the base voltage, it can be seen that the value of resistor 13, along with the other component values, will establish the oscillator current flow. The value of the collector load will, along with the current value, establish the collector voltage swing. Since the zener diodes establish the transistor base voltage level substantially below that of the opposite transistor collector, there can be a substantial collector voltage swing without producing transistor saturation. In addition, when using a supply potential substantially in excess of the zener voltage, the biasing system can ensure that the zener diodes remain in reverse breakdown throughout the oscillator cycle, thus avoiding cyclic non-linearites. In terms of design, the collector voltage swing plus the zener diode voltage is made substantially less than the supply voltage to avoid any transistor saturation problems and to permit a current flow in the base resistors 14 and 15 that will keep zener diodes 18 and 19 in their reverse breakdown state.

As pointed out above, zener diodes 18 and 19 are matched as are resistors 16 and 17, resistors 14 and 15, and transistors 11 and 12. This gives a fully balanced circuit that can provide a paraphase output at the transistor collectors.

Since the zener diodes are always biased into reverse breakdown, they provide a d-c level shift between transistor collectors and bases. At the same time their dynamic impedance is so low that signals are directly coupled with very little phase shift. In particular, there is no phenomenon wherein a frequency related phase shift is present, as would be the case in capacitive coupling. By virtue of the zener level shift, a substantial signal can be developed across tank circuit 10. Such would not be the case if direct coupling were to be employed. Finally, it is an easy matter to form a suitable zener diode in an IC whereas capacitors are difficult to fabricate precisely and they tend to require a inordinate area.

By way of an example if the oscillator is designed to pass a 10 ma peak current and resistors 16 and 17 are 250 ohms each, the paraphase signal output voltage would be 5 volts peak-to-peak. That is each transistor would swing 2.5 volts below the level of +V. If zener diodes 18 and 19 have a 5 - 6 volt breakdown and using a 15 volt power supply, a 1.12K ohm value could be used for resistor 13 and resistors 14 and 15 could be as high as 10K ohms. The same circuit would operate at 10 volts using a 620 ohm resistor at 13.

FIG. 2 shows a single pin tank. Whereas the FIG. 1 circuit is fully balanced for signal as well as d-c, and provides a paraphase output, the circuit of FIG. 2 is unbalanced. This is significant in IC technology. In the FIG. 1 circuit, the tank 10 requires two external IC connections to operate. Hence, it is a two-pin circuit. Since pin connections are at a premium in IC technology, the FIG. 2 circuit will be preferred where a paraphase output is not required. Essentially, in FIG. 2 tank 10 is directly returned to +V so that only a single external circuit pin is needed to complete the circuit. Except for the fact that the base of transistor 11 and the collector of transistor 12 are operated at fixed potentials, the circuit operates much like the circuit of FIG. 1. The single collector load resistor 20 provides the single ended circuit output node. One additional circuit effect is that if the circuits of FIGS. 1 and 2 are designed to identical a-c conditions, the Q of the FIG. 2 circuit will be one half that of the FIG. 1 circuit Q. If resistor 20 is doubled to establish the double Q value, resistor 13 would have to be increased in value to maintain the same ac output.

FIG. 3 is an improved version of a single pin oscillator circuit. The elements are much like those of FIG. 2 except that a current mirror is used to bias the zener diodes. Transistors 21 and 22 are desirably matched and coupled together so that the current flowing in resistor 23 is mirrored as the collector current of transistor 22. Resistors 24 and 25 are made equal to balance the current mirror. In some cases resistors 24 and 25 will be omitted and emitters connected directly to ground. Since zener diodes 18, resistor 23, diode-connected transistor 21, and resistor 24 are all in series between +V and −V, a fixed current will flow in zener diode 18. Because of the current mirror action an identical current will flow in zener diode 19 regardless of how its terminal voltages swing. Thus the circuit of FIG. 3 is fully balanced so as to have minimum effect upon the stability of tank 10 and the zener diodes have equal and constant currents.

The oscillator circuits of FIGS. 1 - 3 provide excellent performance in that they minimize adverse loading effects on the associated tank. While tank 10 is shown as a typical L-C antiresonant device, it could be replaced by the antiresonant terminals of a quartz crystal, a ceramic resonator, or any other antiresonant device that has an impedance maximum at its zero phase shift frequency.

While the above described circuits have excellent characteristics, particularly in IC form, there is inevitably some reaction on the associated tank. The transconductance $gm$ of the devices used in the oscillator has a negative temperature coefficient (IC) which undesirably affects the frequency stability. In addition, the zener diodes of the kind used in a silicon IC have a positive TC of zener voltage of about 3 mv per degree centigrade. This means that as temperature rises, the oscillator current will tend to fall.

It has been found that if a self compensated tank is employed, or one in which the TC of the capacitor is chosen to offset the TC of the inductor, the oscillator can be compensated if the oscillator supply current is caused to rise at a rate of about 0.3% per degree centigrade. This action is achieved in the circuit of FIG. 4 wherein a temperature responsive current source is connected into the emitter circuit of an oscillator of the kind shown in FIG. 1.

Resistor 30 is made small and serves to isolate the oscillator from current source capacitance effects. The following description is directed to means for controlling current I as a function of temperature.

Zener diode 31, which is biased into reverse breakdown by resistor 32, is the basic temperature transducer. For the kind of zener diode to be used a zener voltage of 7V and TC of about +3 mv/degree C is typical. Since transistor 33 is connected as a conventional emitter follower, its emitter-base voltage will have a TC of about −2mv. Relative to the potential at the emitter of transistor 33 to ground, the TC will therefore be about +5 mv/degree C. Between the emitter of transistor 33 and ground a series circuit exists comprising resistors 34 and 35 and the series base-emitter circuits of transistors 36 and 37. Since the base-emitter circuits of the transistors each have a TC of about −2 mv/degree C and they are in series, the overall TC of the voltage across resistors 34 and 35 will be about +9mV/° C. The actual voltage across resistors 34 and 35 is the zener voltage less 3 base-emitter potentials, or about 4.9V. Thus +9mV/° C represents an 0.18%/° C increase in the voltage across resistors 34 and 35. When fabricated using IC technology resistors 34 and 35 are p-diffused and themselves have a +0.18%/° C TC. Thus the current through resistors 34 and 35 can be regarded as substantially constant.

Since transistors 36, 37, and 38 operated in conjunction with resistors 35 and 39 comprise a current mirror, the current through resistor 39 has a substantially zero TC. The $V_{BE}$ of transistor 38 has a TC of 2 mv/ degree C which tends to give the current through resistor 40 a negative TC. The current I flowing in source 38 is the difference of the currents flowing in resistors 39 and 40 respectively. Since a negative TC current in resistor 40 is being subtracted from a zero TC current in resistor 39 the resulting current I has a substantially positive TC. Thus the actual value of I will rise with temperature, to offset the natural tendency of the oscillator gain to fall with increasing temperature. Resistor 40 which carries substantially the collector current in transistor 36 permits making resistor 39 substantially smaller than resistor 35 and will thereby set the actual value of the output current TC.

EXAMPLE

The circuit of FIG. 4 was constructed in IC form using the following part values.
Tank circuit 10 — TV CH 3 (61.26 MHz)
Resistor 14 — 2.7K ohms
Resistor 15 — 2.7K ohms
Resistor 16 — 240 ohms
Resistor 17 — 240 ohms
Zener Diode 18 — 5.6 volts
Zener Diode 19 — 5.6 volts
Resistor 30 — 1K ohms
Zener Diode 31 — 7 volts
Resistor 32 — 8.2K ohms
Resistor 34 — 4.3K ohms
Resistor 35 — 620 ohms
Resistor 39 — 175 ohms
Resistor 40 — 560 ohms.

All transistors were of conventional NPN IC device construction and were all of the same size and shape. Tank circuit 10 was constructed of components having opposing and equal TC values. The value of I in the collector of transistor 38 was about 2 ma at 25° C using a 15 volt power supply. The value of I was found to rise at about 0.3%/° C. The oscillator, using L-C tank components of conventional availability, had an output of 1 volt peak-to-peak and displayed a stability of better than 50 ppm/° C over a 100° C temperature range.

The invention has been described in detail and a practical operating example set forth. It is clear that a person skilled in the art will naturally recognize that there are equivalents and alternatives. For example, while all NPN transistors have been described, PNP devices could be used, provided all electrical polarities are suitably reversed. Also PNP devices could be combined with NPN devices to achieve the desired results. Accordingly, it is intended that the scope of my invention be limited only by the following claims.

I claim:

1. A transistor oscillator suitable for incorporation into a bipolar integrated circuit in which the frequency of oscillation is determined by an externally connected antiresonant tank circuit, and adapted to operate from a single source of operating potential, said circuit comprising:

a pair of transistors, the emitters of said pair being coupled together and coupled through conductive impedance means to a first terminal for connection to said source of operating potential, the collectors of said pair being coupled to terminals adapted for connection to said tank circuit, conductive impedance means coupling said collectors to a second terminal for connection to said source of operating potential, and the bases of said pair being coupled through a current mirror to said first terminal of said source of operating potential, said current mirror operative to equalize the currents flowing in the two branches thereof coupled to said bases of said pair of transistors;

2. The circuit of claim 1 wherein said pair of transistors comprises matched elements and said first and second zener diodes are matched.

3. The circuit of claim 2 wherein said conductive impedance means coupling each of said collectors to said second terminal comprise substantially different impedance values, one of which is essentially zero.

4. The circuit of claim 2 wherein said conductive impedance means coupling each of said collectors to said second terminal comprise resistor elements of like value whereby said circuit is balanced.

5. An integrated circuit oscillator adapted to operate from a source of operating potential and an extremely connected anti-resonant tank, said circuit comprising a pair of transistors coupled together to function as a differential pair, said collectors of said pair being coupled to terminals adapted for connection to said tank and to means for coupling said collectors to one terminal of said potential source, said bases of said pair being coupled to means for biasing said pair;

a pair of zener diodes cross coupled between the collectors and bases of said pair to provide positive feedback coupling in said pair, said diodes poled to operate in reverse breakdown responsive to said biasing means;

a current source transistor having a collector coupled to the emitters of said pair of transistors and an emitter coupled to the other terminal of said potential source; and means for biasing said current source transistor to produce a collector current that rises with temperature to stabilize the gain of said pair.

6. The integrated circuit of claim 5 wherein said circuit is fabricated in silicon and said current source is biased to produce a collector current that rises at a rate of about 0.3% per ° C.

* * * * *

UNITED STATES PATENT AND TRADEMARK OFFICE
CERTIFICATE OF CORRECTION

PATENT NO. : 4,063,193
DATED : December 13, 1977
INVENTOR(S) : Milton E. Wilcox

It is certified that error appears in the above-identified patent and that said Letters Patent are hereby corrected as shown below:

In claim 1, after line 14 of column 6, insert

-- a first zener diode coupling the collector of the first transistor of said pair to the base of the second transistor of said pair; and a second zener diode coupling the collector of the second transistor of said pair to the base of the first transistor of said pair; said zener diodes being poled so as to be reverse biased by said source of operating potential. --

Signed and Sealed this

Second Day of May 1978

[SEAL]

Attest:

RUTH C. MASON
Attesting Officer

LUTRELLE F. PARKER
Acting Commissioner of Patents and Trademarks